United States Patent [19]

Pollara-Bozzola

[11] Patent Number: 4,730,322
[45] Date of Patent: Mar. 8, 1988

[54] METHOD AND APPARATUS FOR IMPLEMENTING A MAXIMUM-LIKELIHOOD DECODER IN A HYPERCUBE NETWORK

[75] Inventor: Fabrizio Pollara-Bozzola, Los Angeles, Calif.

[73] Assignee: California Institute of Technology, Pasadena, Calif.

[21] Appl. No.: 781,224

[22] Filed: Sep. 27, 1985

[51] Int. Cl.⁴ .............................................. G06F 11/10
[52] U.S. Cl. ........................................................ 371/43
[58] Field of Search ............................ 371/43, 44, 45; 364/200, 900

[56] References Cited

U.S. PATENT DOCUMENTS

| 4,015,238 | 3/1977 | Davis | 371/43 |
| 4,247,892 | 1/1981 | Lawrence | 364/200 |
| 4,493,082 | 1/1985 | Cumberton | 371/43 |
| 4,500,994 | 2/1985 | McCallister | 371/43 |
| 4,545,054 | 10/1985 | Davis | 371/43 |

Primary Examiner—Michael R. Fleming
Attorney, Agent, or Firm—Jackson & Jones

[57] ABSTRACT

A method and a structure to implement maximum-likelihood decoding of convolutional codes on a network of microprocessors interconnected as an n-dimensional cube (hypercube). By proper reordering of states in the decoder, only communication between adjacent processors is required. Faster and more efficient operation is enabled, and decoding of large constraint length codes is feasible using standard VLSI technology.

11 Claims, 12 Drawing Figures

FIG. 6a
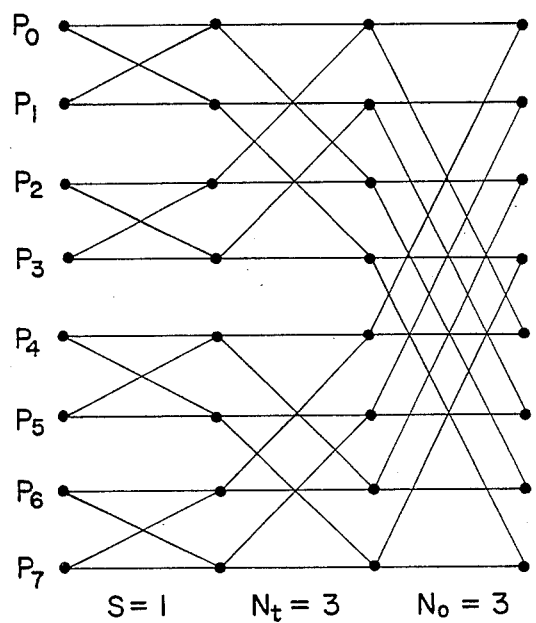
FIG. 6b
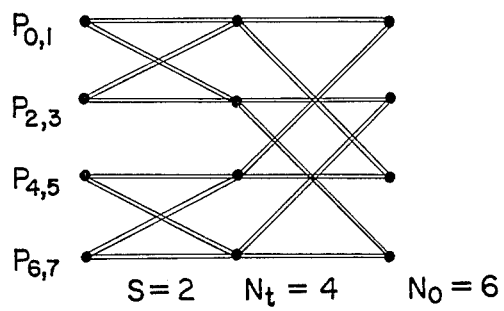
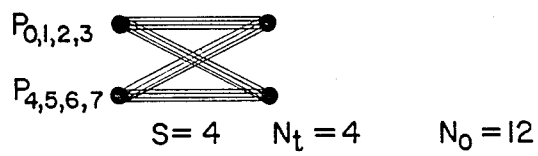
FIG. 6c

STATE

PROCESSOR

| 0 0 | 1 1 | 1 0 | 1 1 | 1 1 | 0 1 | --- |

RECEIVED SEQUENCE

| 0 | 1 | 0 | 0 | 1 | 1 | --- |

DECODED SEQUENCE

METHOD AND APPARATUS FOR IMPLEMENTING A MAXIMUM-LIKELIHOOD DECODER IN A HYPERCUBE NETWORK

BACKGROUND OF THE INVENTION

1. Origin of the Invention

The invention described herein was made in the performance of work under a NASA Contract and is subject to the provisions of Public Law 96-517 (35 USC 202) in which the contractor has elected to retain title.

2. Field of the Invention

The present invention is concerned with a method for maximum-likelihood decoding of convolutional codes on a network of microprocessors, and apparatus for executing this method.

3. Brief Description of the Prior Art

A concurrent computing system in which individual computers, each with a computational processor and a message-handling processor, are connected as a hypercube is described and claimed in an application entitled "Concurrent Computing System Through Asynchronous Communication Channels, Ser. No. 754,828, filed on July 12, 1985 and assigned to California Institute of Technology. As there described, N nodes (numbered 0, 1,—N−1) are connected together in a binary (or Boolean) n-dimensional cube in which $N=2^n$ or $n=\log_2 N$. The above-identified application depicts one representative hypercube connection of a network of processors in which the processors are located at the vertices of an n-dimensional cube and communicate with each other by bidirectional communication links only along the edges of the cube. One manner of transmitting data and representative examples of microprocessor hardware and software suitable for performing the data transfer feature of this invention is fully disclosed in the above-identified application.

Hypercube-connected multiprocessors having up to 128 nodes (n=7) are known, and will soon be extended to 1,024 nodes (n=10) and higher. As the number of nodes increases, it is imperative that the number of connections per decoder at each node be kept to a minimum. Otherwise, the existing pin-limitation constraint of VLSI decoders cannot be accommodated.

Maximum-likelihood decoding of convolutional codes is also well known. The Viterbi decoding algorithm is commonly used for such decoding, and many textbooks such as "Theory and Practice of Error Control Codes" by Richard E. Blahut, Addison-Wesley Publishing Company, Inc. Copyright 1983 describe the encoding/decoding of convolutional codes. A Viterbi decoding algorithm is conceptualized in the text and a succinct summary of a trellis diagram, stages, stages and common steps to obtain accumulated metrics and survivors is described at pages 350 through 353 and 377 through 382 of that text.

Convolutional codes are widely used in digital communication systems to decrease the probability of error on a given noisy channel (coding gain). They are characterized by the constraint length K and by the code rate given by the ratio $k_0/n_0$, where $n_0$ channel symbols are generated by the encoder for each $k_0$ input data bits. Details can be found, for example, in the above-noted "Theory and Practice of Error Control Codes," by R. E. Blahut.

Convolutional codes can achieve large coding gain if they use large memory m, or equivalently, large constraint length $K=m+k_0$. An encoder for such codes is a finite-state machine with $2^m$ states. The complexity of a maximum-likelihood decoder is approximately proportional to the number of states, i.e., it grows exponentially with m.

The task of the decoder is to consider all possible paths on a trellis of about 5m stages, and find the most likely path, according to a specified goodness criterion. The goodness criterion is described in the article "The Viterbi Algorithm," by G. D. Forney, Proc. IEEE, Vol. 61 (1973), pp. 263–278.

SUMMARY OF THE INVENTION

Multiprocessor systems have the potential to obtain large computation power. This is possible if one can solve the problem of how to decompose the decoding algorithm. There are two key requirements in the problem decomposition: (1) divide the algorithm in equal parts, in order to share equally the resources available in each processor, and (2) minimize the communication between the parts, so that each processor needs to share information only with nearest neighbors.

Since a single microprocessor or VLSI chip cannot accommodate all the functions required to implement complex decoders, methods must be found to efficiently use a network of processors. Parallel decoding is accomplished by a network of processors with each processor connected as the edges of an n-dimensional cube. The paths to be examined and stored by each processor are shared only with neighboring processors on the cube. Each neighbor is interrogated to find the goodness of the updated paths and therefore decide which ones should be stored.

The most basic embodiment assigns each available processor to each single state of the decoder. The proper reordering of paths and states is obtained by making a given processor x act as state $\hat{x}$, where $\hat{x}$ is a function of x and the stage of the trellis, based on cyclic shifts of the binary label representing x.

The method also provides a way to group sets of $S=2^s$ states into each processor still requiring only communication between neighboring processors. This arrangement yields high computational efficiency for complex codes.

FEATURES OF THE INVENTION

It is a feature of the invention to provide a method and apparatus for maximum-likelihood decoding of convolutional codes on a network of microprocessors interconnected as a n-dimensional cube and having each processor compute part of all paths of a trellis diagram in parallel with concurrent computations by other processors in the cube. This feature results in high efficiency, in terms of decoding speed, and allows use of codes more complex than those presently decodable with known methods.

In accordance with the present invention, a method is provided for decoding convolutional codes, by the accumulated metric and survivor steps of the known Viterbi algorithm, but with the novel and unique difference that decoding operations are performed in parallel by a network of processors placed at the vertices of an n-dimensional cube, and bidirectionally communicating with neighboring processors only along the edges of the cube. This decoding method can operate with high efficiency because the parallel decoding operations concerning each state of the decoder are performed in a suitable and novel order within each processor.

Further provided is an arrangement for implementing this novel method, comprising a decoder structure which is characterized by:

a network of $N=2^n$ processors interconnected as an n-dimensional cube, having bidirectional communication along the edges of the cube for receiving/transmitting to neighboring processors accumulated metrics and hypothesized data sequences (survivors), to internally store said quantities, and to perform comparisons between accumulated metrics;

input means for sending the received channel symbol sequence to all processors in the network; and output means for delivering the decoded, most likely, data sequence to a user.

The arrangement can accommodate different numbers $S=2^s$ of the $M=2^m$ decoder states into each processor, depending on the code complexity and the number of available processors $N=2^n$, where $M=S\times N$.

BRIEF DESCRIPTION OF THE DRAWINGS

FIG. 6, including FIGS. 6a, 6b, and 6c, contains the arrangements for decoders with M=8 states and S=1, 2, or 4 states per processor, respectively;

DETAILED DESCRIPTION OF THE DRAWINGS

Convolutional codes are well known. Such codes can achieve large coding gain, i.e., improvement on the overall performance of a digital communication link, if they use large memory m, or equivalently, large constraint length $K=m+1$ (in the simple case when $k_o=1$). An encoder for such codes is a finite-state machine with $2^m$ states. Decoders for convolutional codes can be effectively described in terms of a graph called a trellis diagram, as shown in FIG. 1 for an m=3, 8-state code.

Figure 1:
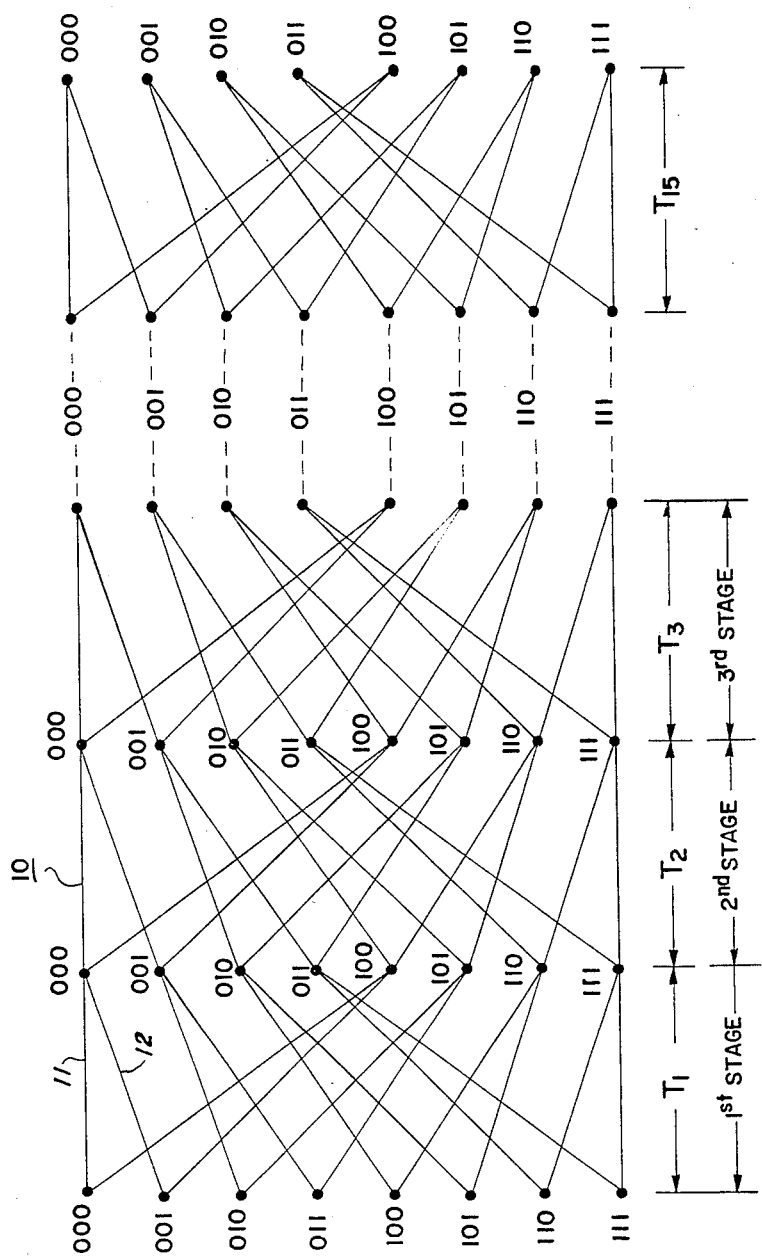
FIG. 1 is a trellis diagram of the Viterbi algorithm, showing all the possible state transitions for an 8-state decoder ($M=2^m=8$, $m=3$). Only four stages are shown, but the trellis can be extended as necessary.

The left-hand column of FIG. 1 shows all of the possibilities for a three-bit grouping in a finite state coding machine of three shift register cells, or memory m=3. In keeping with the Viterbi decoding algorithm, a decoder would examine all eight possibilities by using an iterative trial. Each iteration corresponds to a separate vertical column such as iteration No. 1, No. 2, etc., through 15. The number of iterations in a time sequence, with time being depicted horizontally, is shown in FIG. 1 for 15 iterations. It is a rule of thumb that 15=5m iterations will almost always yield the proper result. Obviously more iterations can be tried, but the extra number of iterations normally does not achieve any significantly-improved results.

The task of the decoder is to consider all possible paths on a trellis of about 5m stages, and find the most likely path, according to a specified goodness criterion. The goodness criterion is simply a number of merit which will be explained in more detail hereinafter for a typical simplified example of FIG. 8. Suffice it to say at this point that a received sequence of symbols is viewed by the decoder as simply a trial of hypothesized sequences. As each new received symbol is considered, the weighted values of trellis paths are reviewed by the decoding algorithm and the lowest number (indicating the highest level of goodness) is temporarily chosen as the best possible candidate to match the one that was originally encoded.

The trellis diagram 10 in FIG. 1 is used in the Viterbi algorithm to represent all possible transitions between states as described in the above-mentioned articles. In particular, at each stage all eight states are examined and only one of the two possible paths 11, 12 coming into a state (such as 000) is preserved, along with its goodness or likelihood measure, called an accumulated metric. At a given time (stage), such as time $T_1$, each state is associated with one (and only one) path (path 12, for example) reaching it. The algorithm performs the following steps:

(1) Update the value of the accumulated metric of the two paths converging into each state, according to a known rule This known rule, described in detail in the above-referenced paper by Forney consists, in summary, of adding the so-called branch metric, which depends on the received symbol, to the accumulated metrics of the paths converging into each state;

(2) Choose the preferred path between those two, according to their metrics; and (3) Store the chosen path and its metric.

Figure 3:
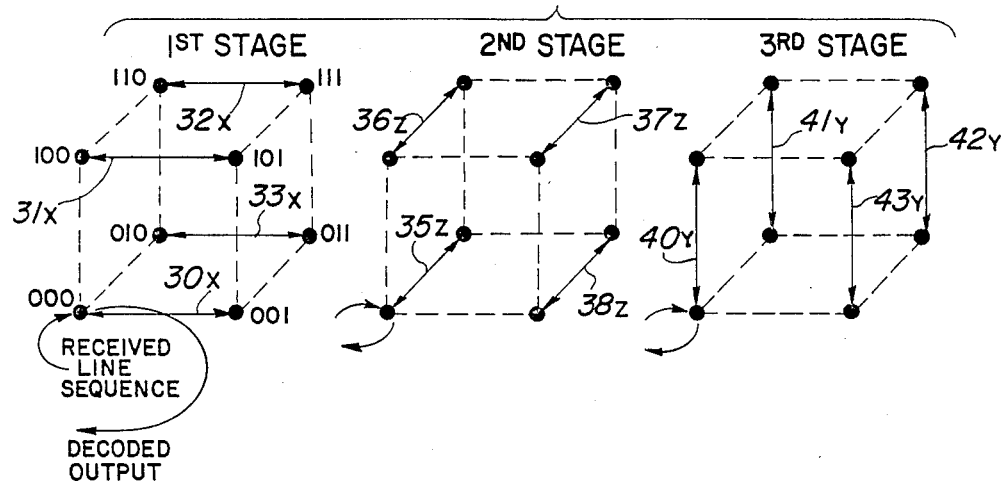
FIG. 3 is an example of an n-dimensional cube (n=3) network of microprocessors placed at the vertices of the cube, where solid lines show connections used in a given stage.

Before describing the trellis for the processor/decoder method and apparatus of this invention, a brief review of the simplified diagram of FIG. 3 is believed helpful. The earlier-identified application discloses a complete concurrent processing system in which bidirectional communication links transmit data along the edges of a cube. For simplicity sake each mode, or processor, is shown simply as a dot. In FIG. 3, the bidirectional communication links are shown as solid lines with double-headed arrows $30_x$ through $33_x$, $35_z$ through $38_z$ and $40_y$ through $43_y$, respectively. The x, y and z indicate directions of communication in the cube. Associated with the corner locations of the cube network are binary labels which identify the processors. For example, processor $P_0$ is identified by the tribit group 000, $P_1$ by the tribit group 001, etc. Each processor $P_{000}$ ($P_0$) through $P_{111}$ ($P_7$ is connected only to its n neighbors. It is desirable to use direct communication links between processors, in order to speed up communication. Bidirectional link $30_x$ delivers bit sequences back and forth between processors $P_0$ and $P_1$ in any well-known manner. Likewise, as shown, link $31_x$ is connected between $P_4$ and $P_5$, link $32_x$ is connected between $P_6$ and $P_7$, and link $33_x$ is connected between P2 and P3. In the second stage of FIG. 3, bidirectional link $35_z$ is connected between processors P0 and P2, link $36_z$ is connected between P4 and P6, etc. as is there depicted.

Since complex codes have a very large number of states, it becomes impossible to perform sequentially all the above steps in reasonable time with a single processor. It is therefore desirable to share the work-load among many processors working in parallel. A convenient topology for a network of processors is the n-dimensional cube structure described above. Processors must be able to communicate among themselves in order to exchange intermediate results. Therefore, the decoding process will include some time spent in computations internal to each processor, and some time for interprocessor communication. It is this latter communication time which must be kept as small as possible to yield high decoding efficiency.

The advantage which can be achieved by the invention is the ability to use large constraint length convolutional codes, which yield high coding gain and to keep acceptable decoding speed with feasible hardware.

This is due to the fact that the efficiency of the method, given by $$\eta = \frac{N_o t_o}{N_o t_o + N_t t_t} = \frac{\text{sequential alg. time}}{N \times (\text{parallel alg. time})},$$

where $N_o$ is the number of parallel metric comparisons, $t_o$ is the comparison time, $N_t$ is the number of parallel survivor exchanges, and $t_t$ is the exchange time. The efficiency remains high even when a large number of processors are used.

While $t_o$ and $t_t$ depend on the hardware technology used for the processors, the method yields $N_t = S(m-s) = (M_n/N)$ $N_o = Sm = (M_m/N)$.

so that the efficiency is always above the ratio $$\frac{t_o}{t_o + t_t}$$

which is reached when N=M.

We assign each state of FIG. 1 to a different processor, so that all operations concerning all states can be done simultaneously (in parallel) at each stage, and sequentially stage by stage. Upon examination, however, I discovered that if we assign state 0 to processor P0, state 1 to processor P1, and so on up to state N−1 to processor $P_{N-1}$ (P7) and we consider processors connected as in FIG. 3, then links between processors which are not directly connected in FIG. 3 would be necessary to implement all links between the states or processors in FIG. 1. My novel solution included mapping the states in the trellis 10 of FIG. 1 as the hypercube trellis 20 of FIG. 2.

Figure 2:
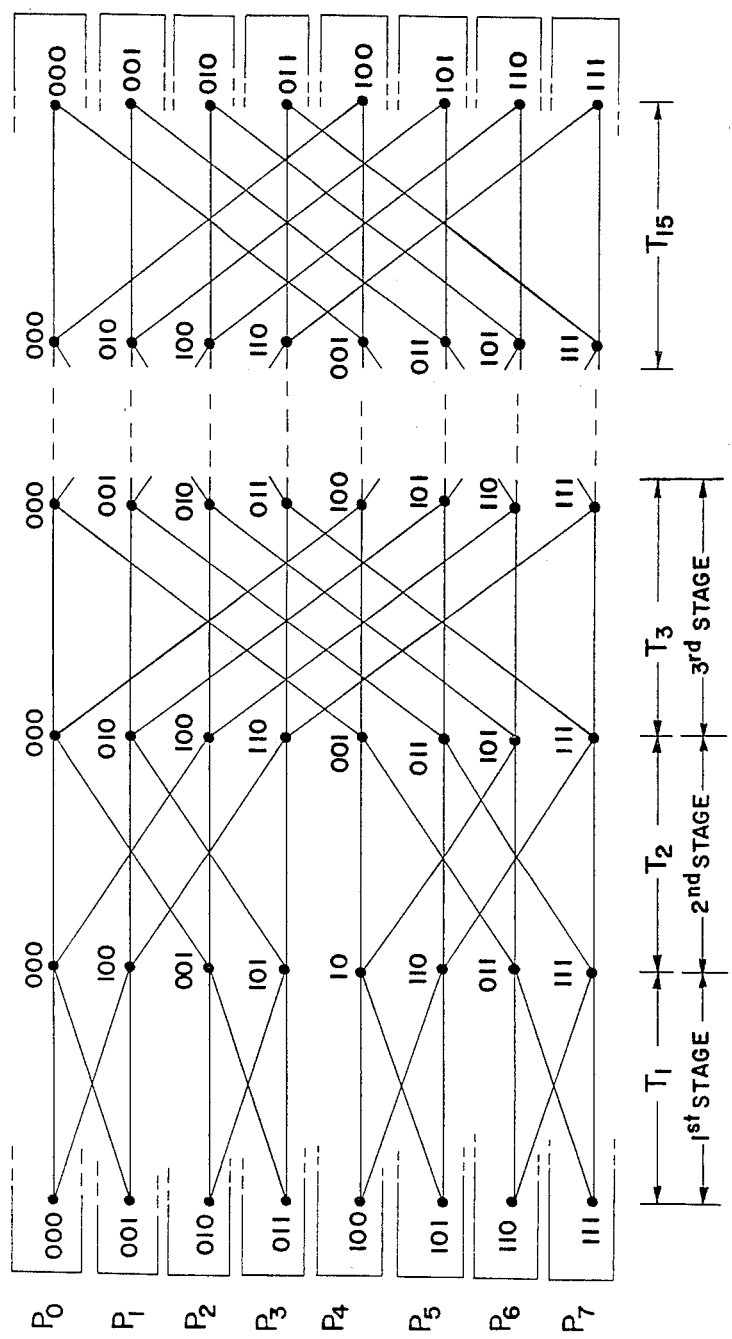
FIG. 2 is the hypercube trellis diagram of this invention showing transitions between processors $P_i$ of the hypercube and the states represented by each processor. The trellis can be extended by repeating the m stages shown, to form a periodic structure.

According to the principles of my invention, a given processor is not assigned to a fixed state, as was the case in FIG. 1. Instead, for my invention the processors are identified by a binary label (P0=P000, P1=P001, etc.) as shown in FIG. 2, and the trellis labelling and stage order is uniquely defined by the following formula. In particular, processor x represents state $\hat{x}$ at stage k, if $\hat{x} = \rho^{(k)}(x),$ where $\rho^{(k)}(.)$ is the cyclic right shift of x by k binary positions. A path through given states in FIG. 1 is thus represented by a specified equivalent path in FIG. 2, which passes through the same states. This means that there is a well-defined correspondence between paths in FIGS. 1 and 2. According to this correspondence, a Viterbi-type algorithm, based on the trellis of FIG. 1, can be performed on the hypercube trellis of FIG. 2.

The interesting and useful property of the trellis diagram of FIG. 2 is that all the required links between processors are now exactly those available in the hypercube network of FIG. 3. The first stage labeled as such in FIG. 3 shows how the first stage of FIG. 2 can be performed by using the connections $30_x$ through $33_x$ (marked with solid lines and double-headed arrows) between processors P0, P1 and P2, P3 and P4, P5 and P6, P7, respectively. Similarly, the second and third stages of FIG. 3 show the bidirection communication lines required for implementation of the second and third stages of FIG. 2. It should be understood that the embodiment of the decoder on the network has been explained for the case m=3, but it clearly can be generalized to other decoder sizes and hypercube dimensionality.

Figure 4:
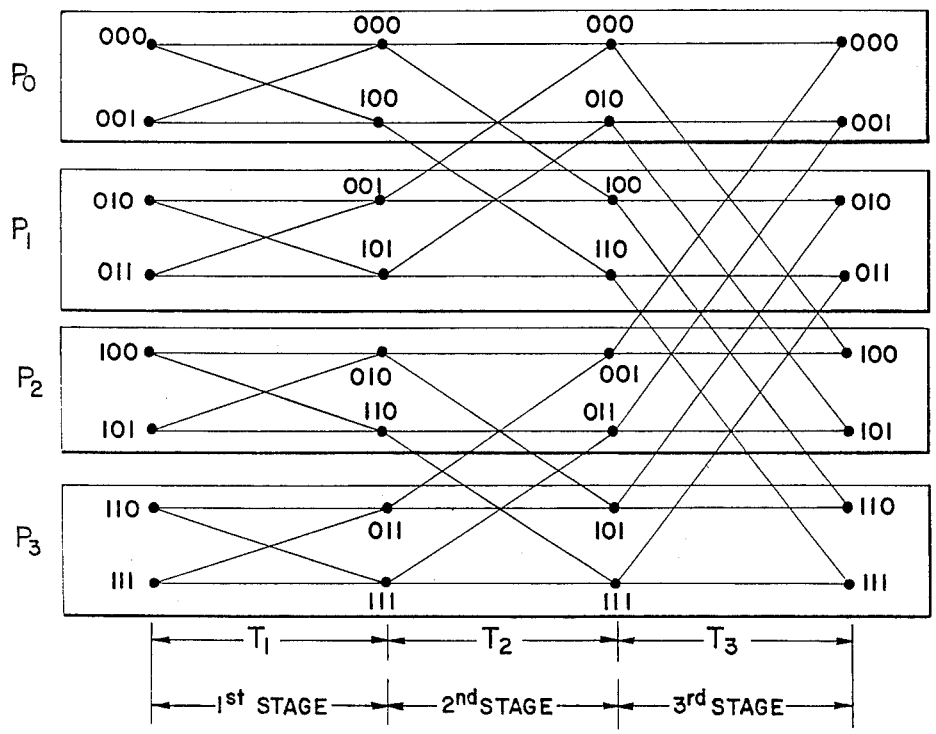
FIG. 4 is a specific decoder structure where two states are representated by each of the four processors.

When the number of states is larger than the available or feasible number of processors, it becomes necessary to assign more than one state per processor. This can be done as shown in FIG. 4, where S=2 states are assigned to each processor. The required interprocessor communication links are provided by a two-cube-connected processor system which requires two decoding operations within each state. The method and apparatus of this invention thus generalizes to a number of states per processor which is a power of two, i.e., $S=2^s$, where S is the number of states per processor.

Figure 5:
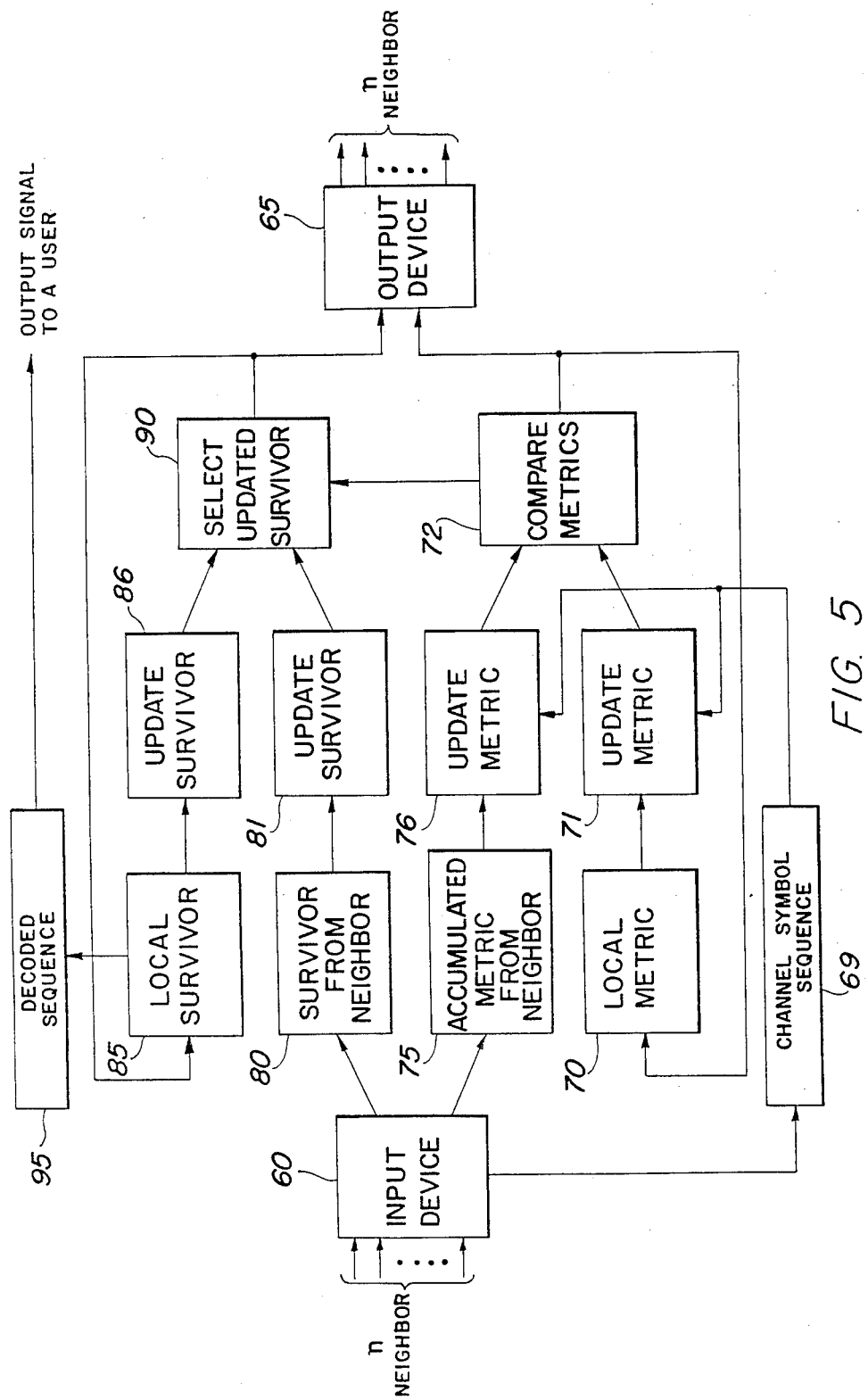
FIG. 5 is a block diagram of the internal arrangement of each processor in the network.

The simplest embodiment of the invention is shown in FIG. 5 for the case of one state per processor S=1. The block diagram represents the arrangement used in each processor of the hypercube, where the input and output devices 60 and 65 sequentially connect to neighbors along each dimension of the cube, one dimension at a time, as shown by stages 1, 2 and 3 of FIG. 3. The block diagram of FIG. 5 may be thought of as a particular means for performing the several desired functions. FIG. 5 is a timed operation which is readily performable by any well-known and available processor, and to this extent FIG. 5 may be thought of as a flow diagram for the various computations.

Although not depicted, it should be understood that all processors are initialized to the same initial state. Operation of the decoder requires that blocks of initializing data be loaded in every processor by an operation called "broadcasting." In the hypercube network of processors under consideration, data from a host processor is directly exchanged only through node zero (the origin of the cube). An efficient concurrent method is required to broadcast a message from node zero to all other nodes. Since the diameter D of an n-cube is n, a lower bound on the broadcasting time is n time units (where the unit is the time to send a message to a neighbor).

Assume that a message is in node zero, at time zero. In each subsequent time slot $t_k$ send messages in parallel from each node $x = [x_{m-1}, \ldots, x_{k+1}, 0, x_{k-1}, \ldots, x_0]$ to each node $$x' = [x_{m-1}, \ldots, x_{k+1}, 1, x_{k-1}, \ldots, x_0],$$

the neighbors along dimension k. After n time units, the message has propagated to all nodes.

Even though this method does not minimize the number of communications (with the advantage of a very simple indexing), it optimizes the total broadcasting time to n time units. The result is clearly optimum, since it achieves the lower bound.

At the start of the hypercube decoding algorithm, input device 60 loads a received channel sequence to be decoded into a suitable storage device 69. As noted earlier, the preferred embodiment of this invention is achieved by VLSI techniques. Thus the storage device 69 may advantageously be an addressable storage space in the processor memory. A sequence of processor computations are then performed by the decoder. The input sequence, stored in memory 69, is used to update both a locally-stored accumulated metric and an accumulated metric that has been received from a neighboring processor. The local metric is stored in a local metric memory 70. That metric value is then updated in the update metric device 71.

Meanwhile, an accumulated metric value from a neighboring processor has been supplied by input device 60 to an accumulated metric storage 75 which is used to store the neighbor's accumulated metric value. The metric at storage 75 is updated and made available in the update metric unit 76. A suitable comparison between those updated metric values is achieved by comparator 72 and the proper metric value is retained as a new local metric value. Note that comparator 72 supplies that new local metric value both to the local metric memory 70 and to the output device 65.

A comparable operation takes place for the survivor values. Thus, input device 60 receives the survivor value from the current neighbor, i.e., the neighbor along the dimension currently in use. That survivor value is stored at 80 and updated at 81. The survivor is simply updated by a table look-up method performed in accordance with the well-known Viterbi algorithm. For this reason no control lead is shown for update circuits 81 and 86.

An updated local survivor and an updated neighbor survivor are supplied to a comparator 90 in order to choose the most likely path. The result of the comparison under control of the selection command from comparison circuit 72 is used to select either the updated local survivor or the updated neighbor survivor in 90. The selected quantities (metric and survivor) are thereafter fed back and stored in the processor as the next upcoming local quantities. Note that both are also available to be sent, via output 65, to a neighbor processor along the appropriate dimension of the cube.

The decoded sequence is formed from the survivors as in the known Viterbi algorithm and is stored in a decoded register sequence 95. The decoded sequence output from storage 95 is delivered to a user. Note that input and output leads are labeled at the origin node in FIG. 3.

In FIG. 6a the trellis diagram is as that shown earlier in FIG. 2 and thus needs no further description. FIG. 6b describes the implementation of the same decoder of FIG. 62a, but with two states per processor (S=2). Note that double lines mean that an exchange of two metrics and two survivors along each bidirectional link between processors is required. Similarly, in FIG. 6c, each processor performs all the operations on a set of four states (S=4).

Figure 7A:
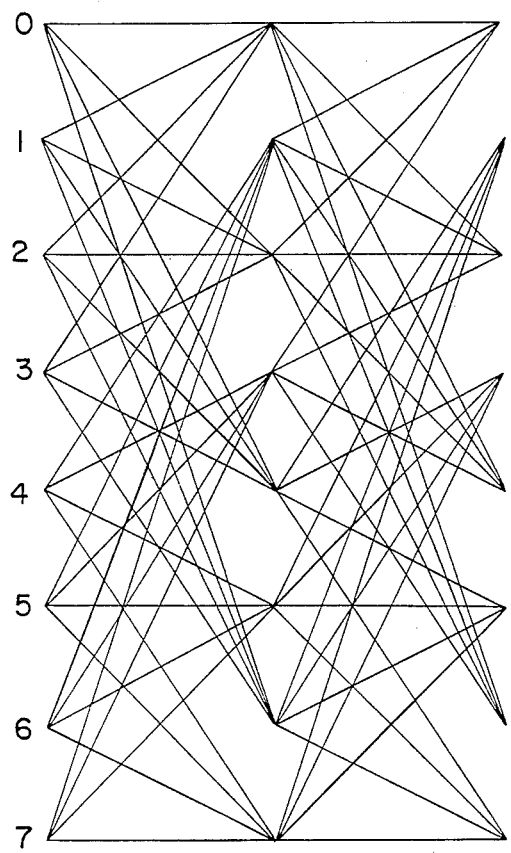
FIG. 7a is a decoder structure on a two-dimensional cube for an 8-state (m=3) code of $k_o/n_o$, where $k_o=2$.
Figure 7B:
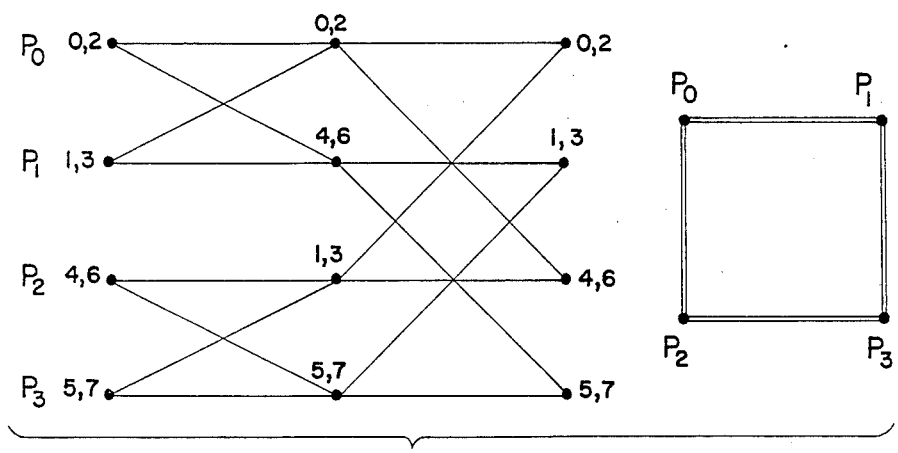
FIG. 7b is a decoder trellis for an 8-state (m=3) code of rate $k_o/n_o$, where $k_o=2$.

When more than one state is assigned to each processor, the invention can be applied to the decoding of a more general class of codes having rate $k_o/n_o$ where $k_o > 1$. FIG. 7 shows a structure for decoding an 8-state code with $k_o = 2$ on a two-dimensional cube with four processors. Again, all the required links in the trellis of FIG. 7a can be implemented on a 2-cube as in FIG. 7b.

Figure 8A:
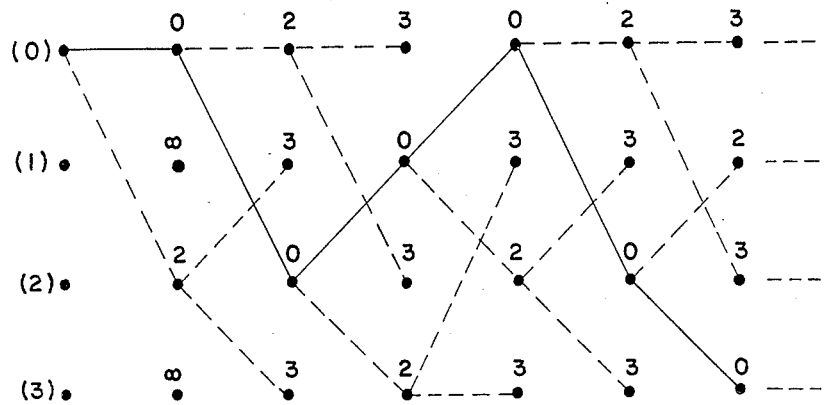
FIG. 8a is a trellis diagram of a four state decoder showing how paths are eliminated according to the usual Viterbi algorithm.
Figure 8B:
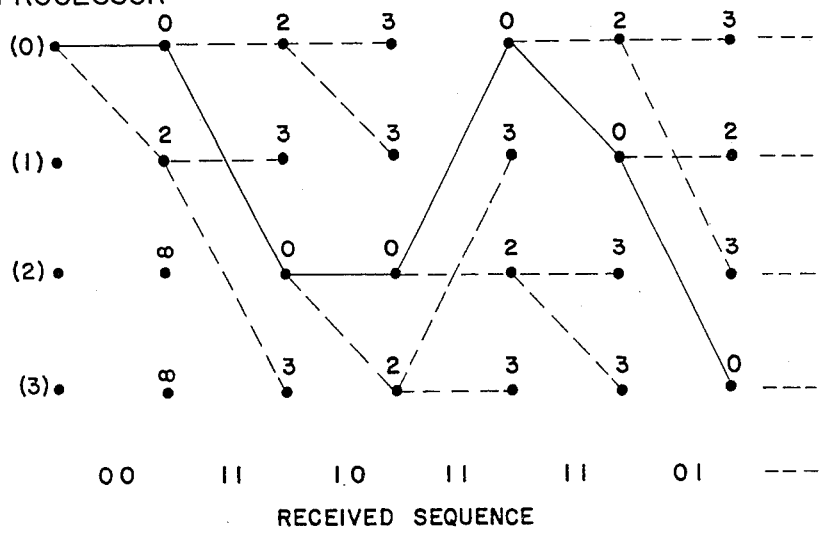
FIG. 8b is a trellis diagram for four states showing how paths are eliminated during the decoding operation of this invention.

FIG. 8 is an example showing how various paths are eliminated during decoding. The solid line in FIGS. 8a and 8b is the path which has been chosen.

Consider, as an example, a decoder for a 4-state rate one-half convolutional code given by the generator polynominals $g_1 = 111$ and $g_2 = 101$. Such a received sequence is given in FIG. 8b.

A conventional decoder searches for the maximum-likelihood path on the graph of FIG. 8a where, for a given received sequence, all survivor paths considered are shown. The decoder of my invention operates as shown in FIG. 8b, where the same survivor paths are shown in terms of transitions between processors. The decoded sequence is obviously the same in both cases, but the transitions in FIG. 8b involve only neighboring processors on a hypercube.

While the invention has been particularly shown and described with reference to preferred embodiments thereof, it will be understood by those skilled in the art that various changes in form and details may be made therein without departing from the spirit and scope of the invention.

What is claimed is:

1. A method for maximum-likelihood decoding of convolutional codes for a received code sequence having $2^m$ states (where m is a whole integer) by a plurality of interconnected processors each of which is normally in communication with all the other processors of said plurality and each provided with a decoding algorithm means for deriving/interchanging decoding parameters including branch metrics, accumulated metrics and survivors in an m-state trellis with each processor fixedly assigned to one state of said trellis, the improvement comprising:

connecting each one of a plurality of $2^m$ processors, equipped with said decoding algorithm means, in an n-cube configuration having bidirectional communication links along the edges only of said cube and certain processors thereof not having a direct communication link between other processors of said n-cube configuration;

mapping an equivalent trellis for said n-cube configuration wherein processors represent more than one state and thus have direct communication links between other processors of said n-cube configuration on said equivalent trellis; and deriving/interchanging the branch and accumulated metrics between the processors which represent all of the states in said equivalent trellis in order to select, by said decoding algorithm means, the maximum likelihood path from said equivalent trellis.

2. A method according to claim 1, and wherein said deiving/interchanging step is further characterized by:

communicating only between adjacent neighboring processors in said n-cube configuration wherein each processor represents different states of the decoder at different stages on said equivalent trellis, according to the relation:

$\hat{x} = \rho^{(k)}(x),$ meaning that processor x in a binary notation represent state $\hat{x}$ at stage k, where $\rho^{(k)}(x)$ is the cyclic right shift of x by k binary positions.

3. A method according to claim 1 comprising the additional preliminary steps prior to said deriving/interchanging step of:

designating one processor of the n-cube network as an origin/output processor; and broadcasting said received signals from said origin processor to all of the remaining n-cube connected processors.

4. A maximum likelihood decoding system for determining accumulated metrics and selecting survivor paths during a repetitive set of stages of a trellis code having a finite number of states M, (where M is a whole integer), said system comprising:

N processors ($N=2^n$) placed at the vertices of an n-dimensional cube, where n is a whole integer, with each processor assigned to represent more than one state at different stages, k, in a repeating set of stages in the trellis code —that is—each processor x is assigned state $\hat{x}$ according to the relation:

$\hat{x} = \rho^{(k)}(x),$ meaning that processor x represents state $\hat{x}$ at stage k, where $\rho^{(k)}(x)$ is the cyclic right shift of x by k binary position and k is number of the stages which make up a set in the trellis;

means for comprising at each processor accumulated metrics and survivors at said different states of the trellis code at correspondingly different stages numbered (k=0, k=1, k=2, etc.) on the trellis; and bidirectional processor-communication links along the edges only of said n-dimensional cube for exchanging said computed accumulated metrics and survivors only between adjacent neighboring processors.

5. A decoding system in accordance with claim 4, wherein one processor from said plurality is designated as an input processor and further comprising:

input means at said input processor for receiving a coded line sequence to be broadcast to every one of said processors; and output means at said one processor for outputting a chosen maximum-likelihood sequence as a decoded output from said decoding system.

6. A maximum-likelihood decoding method for decoding sequences generated by a convolutional encoding having $M=2^m$ states by considering at the decoder all possible paths on an n-cube trellis and finding the most likely path according to a specified goodness criterion involving decoding parameters, said method comprising the steps of:

forming a concurrent processor network of $N=2^n$ microprocessors interconnected as an n-dimensional cube having one microprocessor each at the vertices of said cube and bidirectional communication links for said microprocessors only along the edges of said cube and corresponding to all paths to be checked on said n-cube trellis by transmitting-/receiving said decoding parameters over said communication links;

broadcasting a sequence to be decoded to every one of said microprocessors;

assigning each of the M states on said n-cube trellis to each of the N microprocessors according to the formula:

$\hat{x} = \rho^{(k)}(x)$ wherein, when expressed in binary notations, microprocessor x represents state $\hat{x}$ at stage k and the function $\rho^{(k)}$ is the cyclic right shift of x by k binary positions and M, m, N and n are whole integers;

computing and storing locally at each microprocessor the decoding parameters; and transmitting/receiving said decoding parameters between neighboring processors in said n-dimensional cube.

7. A decoding method for determining the maximum-likelihood path of a trellis code having $M=2^n$ states representing a line sequence generated by a convolutional encoder and subjected to channel noise, said method involving known decoding algorithms having decoding parameters to be transmitted/received between N ($N=2^n$) decoding processors, with M, N and n being whole integers comprising the steps of:

dividing a decoding algorithm for said processors into equal parts as a power of two from all of said states for processing of each of said equal parts by one each of a plurality of N concurrent processors;

locating $N=2^n$ processors at the vertices of an n-dimensional cube having bidirectional communication paths for said processors only along the edges of said cube;

mapping a trellis with certain processors representing more than one state on the trellis in order to represent all of the M states on said trellis by said N processors, with each of said processors having direct transmitting/receiving paths from neighboring processors along the dimensions of said cube and in said trellis; and computing the maximum-likelihood path for each of the M states by each of the n microprocessors said trellis wherein said processors represent more than one state in an order according to:

$\hat{x} = \rho^{(k)}(x)$ wherein microprocessor x represents a set of states $\hat{x}$ at stages k and the function $\rho^{(k)}$ is the cyclic right shift of x by k binary positions.

8. A maximum likelihood decoding system for determining accumulated metrics and selecting survivor paths of M states of a trellis code in network of $N=2^n$ processors with each processor placed at the vertices of an n-dimensional cube and representing a set of $S=2^s$ states of the decoder formed from said processors; said decoder characterized in that: each processor represents different states of the trellis code at different stages on the trellis, according to the relation:

$x = {}^{(k)}(x),$ meaning that processor x represents state x at state k, where $^{(k)}(x)$ is the cyclic right shift of x by k binary positions.

9. A maximum-likelihood decoding system in accordance with claim 8 and further comprising:

bidirectional processor-communication links along the edges only of said n-dimensional cube for exchanging accumulated metrics and survivors.

10. A decoding system in accordance with claim 9 wherein each of said processors is characterized by means at each processor for computing its local accumulated metrics and for updating the locally-accumulated metrics by adding thereto branch metrics, and said decoding system further comprises:

comparing means in each processor for comparing the local accumulated metrics with those accumulated metrics received over said links from said neighboring processors.

11. A decoding system in accordance with claim 10 and further comprising:

an origin processor at one vertex only of said n-dimensional cube; and means for outputting to a user a decoded signal from said origin processor.

* * * * *